United States Patent
Chun et al.

(10) Patent No.: US 9,168,777 B2
(45) Date of Patent: Oct. 27, 2015

(54) CLICHE FOR OFF-SET PRINTING AND PRODUCT MANUFACTURED USING THE SAME

(75) Inventors: Sang-Ki Chun, Daejeon (KR); In-Seok Hwang, Daejeon (KR); Dong-Wook Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 452 days.

(21) Appl. No.: 13/119,920

(22) PCT Filed: Sep. 28, 2009

(86) PCT No.: PCT/KR2009/005536
§ 371 (c)(1),
(2), (4) Date: Mar. 18, 2011

(87) PCT Pub. No.: WO2010/036075
PCT Pub. Date: Apr. 1, 2010

(65) Prior Publication Data
US 2011/0174176 A1    Jul. 21, 2011

(30) Foreign Application Priority Data

Sep. 26, 2008 (KR) .................. 10-2008-0094460
Sep. 28, 2009 (KR) .................. 10-2009-0091815

(51) Int. Cl.
*B41N 1/06* (2006.01)
*B41N 1/12* (2006.01)
*H05K 3/12* (2006.01)
*H05K 9/00* (2006.01)

(52) U.S. Cl.
CPC .. *B41N 1/12* (2013.01); *B41N 1/06* (2013.01); *H05K 3/1275* (2013.01); *H05K 9/0086* (2013.01); *H05K 2201/09681* (2013.01); *H05K 2203/0534* (2013.01)

(58) Field of Classification Search
None
See application file for complete search history.

(56) References Cited

U.S. PATENT DOCUMENTS

| | | | | |
|---|---|---|---|---|
| 2,182,559 | A * | 12/1939 | Henderson | .................... 359/893 |
| 2008/0084681 | A1 | 4/2008 | Naito et al. | |

FOREIGN PATENT DOCUMENTS

| | | | |
|---|---|---|---|
| JP | 08-274492 | A | 10/1996 |
| JP | 10-335884 | A | 12/1998 |
| JP | 3002503 | B2 | 1/2000 |
| JP | 2004-111784 | | 4/2004 |
| JP | 2004111784 | A * | 4/2004 |
| KR | 10-2007-0050407 | A | 5/2007 |

* cited by examiner

*Primary Examiner* — Joshua D Zimmerman
(74) *Attorney, Agent, or Firm* — Dentons US LLP

(57) ABSTRACT

The present invention relates to a cliche for offset printing for forming a mesh pattern, and more specifically, to a cliche for offset printing comprising a mash pattern with a plurality of intersection units, wherein the plurality of intersection units are formed in a curved shape with a radius of curvature 0.6 to 4 times that of a mesh line width.

When the cliche for offset printing of the present invention is used, line width reductions generated around the intersection units during mesh pattern printing may be reduced. As a result, when a final product is manufactured by using the cliche for printing of the present invention, the surface resistance properties of the product may be improved.

11 Claims, 5 Drawing Sheets

CLICHE FOR OFF-SET PRINTING AND PRODUCT MANUFACTURED USING THE SAME

This application is a National Stage Entry of International Application No. PCT/KR2009/005536, filed Sep. 28, 2009 and claims the benefit of Korean Application Nos. 10-2008-0094460, filed on Sep. 26, 2008, and 10-2009-0091815, filed on Sep. 28, 2009, which are hereby incorporated by reference for all purposes as if fully set forth herein.

TECHNICAL FIELD

The present invention relates to a cliche for offset printing used in the formation of a mesh pattern with a plurality of intersection units and a product manufactured by using the same, and more particularly, to a cliche for offset printing devised to solve the phenomenon of line width reduction generated around the intersection units of the mesh pattern, and a product manufactured by using the same.

BACKGROUND ART

In general, a photolithography process has been used for forming fine patterns in the fields of the related art, such as those of displays and semiconductors. However, because the formation of fine patterns using the photolithography process is performed through operations of photoresist coating-exposing-developing-etching-stripping, the process is generally complex, raw materials such as photoresist, etc. are consumed in large amounts, and liquid waste is generated in the developing and etching processes to thereby incur costs associated with the treatment of liquid waste.

Accordingly, to overcome these problems, methods for forming fine patterns using printing techniques other than the photolithography process have recently been developed. When fine patterns are manufactured using printing techniques, it is advantageous that the process be simple, the consumption of raw materials minimized, and the generation of liquid waste eliminated so as to lower manufacturing costs.

These methods of forming fine patterns using printing techniques have been applied to the formation of a color filter, an electromagnetic shielding (EMI) filter, a thin-film transistor (TFT) wiring and a micro pattern substrate.

Printing methods enabling the formation of fine patterns include gravure printing, offset printing, screen printing, and the like may be used therefor. Among these, offset printing is especially useful because relatively fine printing patterns may be formed to have a uniform thickness.

Offset printing is a method of printing a pattern by applying paste, such as ink, to a groove formed in a pattern of a cliche for offset printing such that the groove is filled therewith, removing the extra paste applied to areas other than the groove using a doctor blade, transcribing the paste filled in the groove to a silicon blanket (removal process), and transcribing the paste already transcribed on the silicon blanket to a subject to be printed (setting process).

A cliche for offset printing is formed by a method of etching a metal substrate to form grooves or by a method of etching a special glass substrate. For example, a thin layer of a material such as chrome is formed on a glass substrate, a photosensitive resin is applied thereto and then, areas in which grooves are to be formed are exposed to a laser beam or the like. Subsequently, the photosensitive resin of the exposed area is removed through a developing process to expose the chrome layer in the areas in which grooves are to be formed and then, the chrome in the exposed areas may be removed by the etching thereof to expose glass, which may be re-etched with a fluoride solution to manufacture a cliche for offset printing with grooves having an appropriate width and depth. However, when a glass substrate is used as a cliche for offset printing, the surface thereof may be easily damaged by being scraped with a doctor blade. In order to solve this, methods of improving the surface strength of a glass substrate by treating the surface of the glass substrate with hybrid nickel or a diamond like coating (DLC) have been recently developed.

Fine patterns may be formed by a simple method of filling a cliche for offset printing manufactured as above, in which a desired pattern is intagliated, with a paste. The method of offset printing is advantageous in that the processes there of are simpler and the manufacturing costs thereof are lower as compared to those of the related art photolithography. However, when a pattern to be printed has a plurality of intersection units, a line width reduction, which is undesirable, may be generated around the intersection units during printing pattern formation using an offset printing method. FIG. 1 is a photograph illustrating a printed mesh pattern using a cliche for offset printing of the related art. As shown in FIG. 1, it can be seen that line width reduction around the intersection units is generated when a mesh pattern is formed using a cliche for offset printing of the related art. Because depressions are generated around the intersection units during the process of scraping the paste applied to the surface of a printing substrate with a doctor blade, the phenomenon of line width reduction may occur. These depression phenomena cause the line width around the intersection units to be reduced, and disconnection may occur when the phenomena are severe. Therefore, when a wiring board has many intersection units or a mesh pattern of an electromagnetic shielding filter printed thereon, it is disadvantageous that the line width around the intersection units be reduced as the resistance properties of a product may be deteriorated by disconnection.

Although the deterioration of resistance properties may be solved to some degree by increasing the line width, permeability may be reduced by an increase in line width, thereby lowering the brightness of a display device.

DISCLOSURE

Technical Problem

An aspect of the present invention provides a cliche for offset printing, capable of solving the limitations of line width reduction around the intersection units, or of line disconnection with almost no effect on overall permeability.

Technical Solution

According to an aspect of the present invention, there is provided a cliche for offset printing, including a mesh pattern with a plurality of intersection units, wherein the plurality of intersection units are formed in a curved shape with a radius of curvature 0.6 to 4 times that of a mesh line width.

The radius of curvature around the intersection units may be 1 to 4 times the mesh line width, and most preferably 1 to 2 times.

In addition, the line width of the mesh pattern may be 10 to 100 μm, and the average pitch of the mesh pattern may be 100 to 1000 μm.

The cliche for offset printing may be either an intaglio plate in which a mesh pattern is intagliated.

The cliche for offset printing may include a metal substrate, a glass substrate, a glass substrate treated with hybrid nickel, or a glass substrate coated with DLC.

According to another aspect of the present invention, there is provided a product including a mesh pattern with a plurality of intersection units, wherein the plurality of intersection units are formed in a curved shape with a radius of curvature 0.6 to 4 times that of a mesh line width. The product may be a wiring board, a circuit board, an electromagnetic shielding (EMI) filter or a color filter.

Advantageous Effects

A cliche for offset printing of the present invention may prevent line width reduction generated around the intersection units or of line disconnection by forming intersection units with a curved shape and increasing the line width around the intersection units.

Moreover, when a pattern is formed by using the cliche for offset printing of the present invention, surface resistance properties may be improved without reducing the permeability and reflectivity.

DESCRIPTION OF DRAWINGS

The above and other aspects, features and other advantages of the present invention will be more clearly understood from the following detailed description taken in conjunction with the accompanying drawings, in which.

BEST MODE

Exemplary embodiments of the present invention will now be described in detail with reference to the accompanying drawings.

Figure 1:
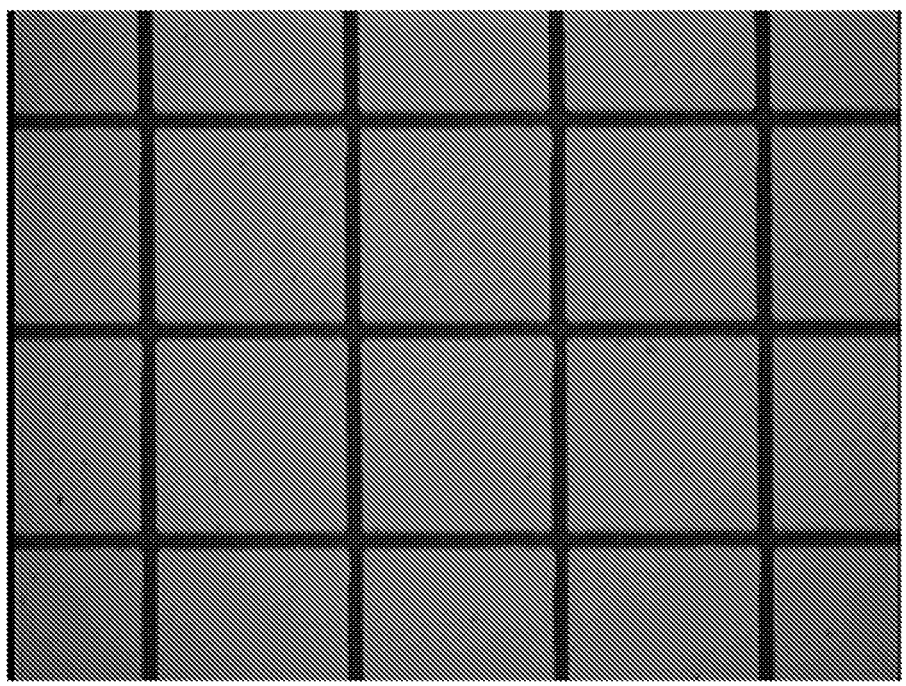
FIG. 1 is a photograph illustrating a mesh pattern printed by using a cliche for offset printing of the related art.
Figure 2:
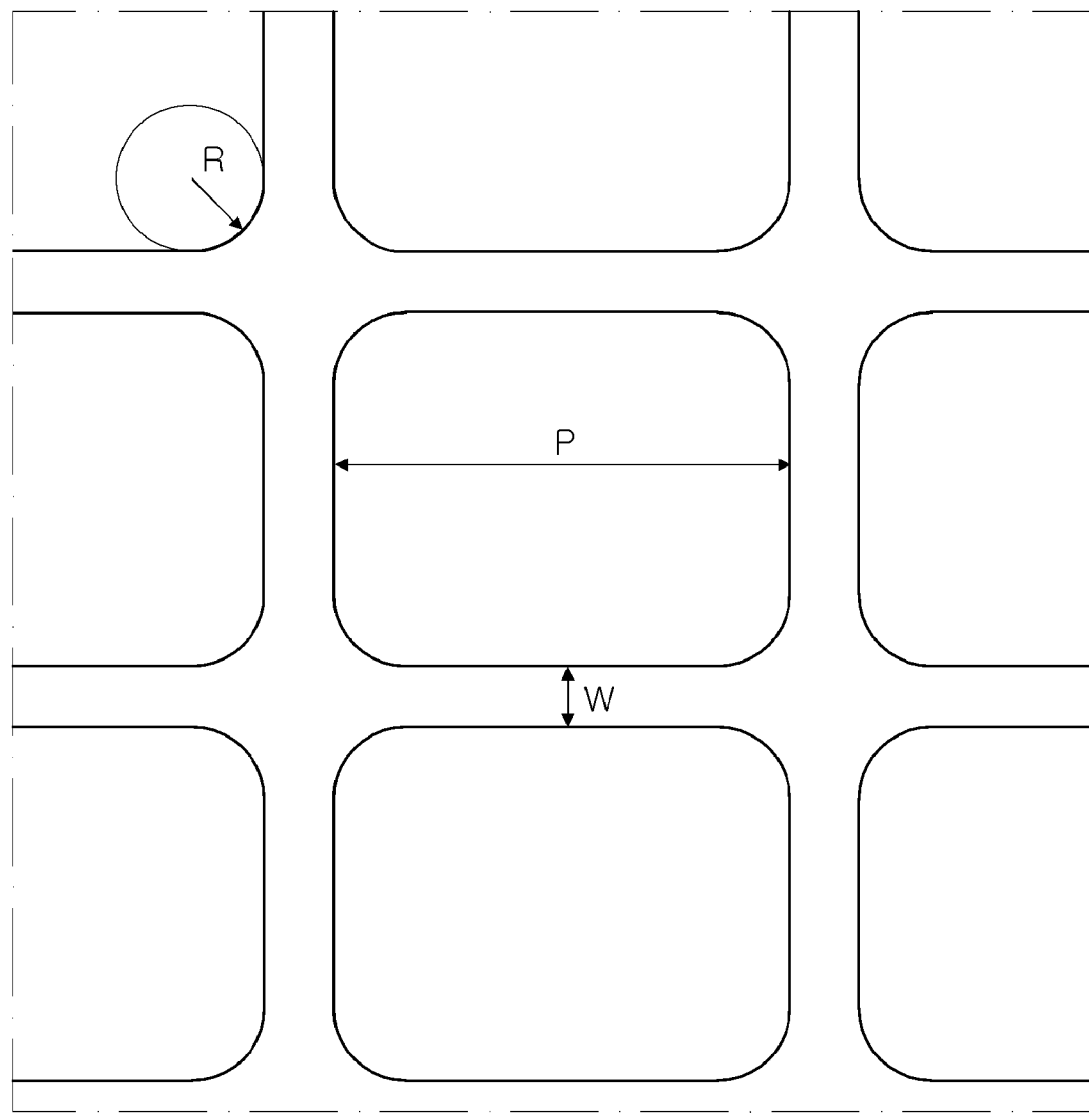
FIG. 2 is a view illustrating a cliche for offset printing of the present invention.
Figure 3:
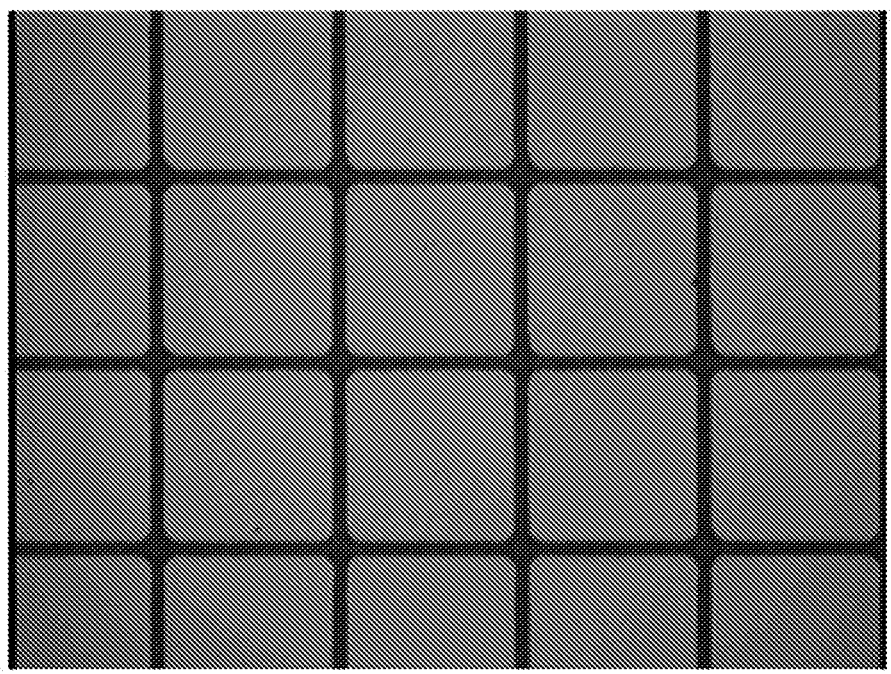
FIG. 3 is a photograph illustrating a mesh pattern printed by using a cliche for offset printing of the present invention.

FIG. 2 is a view illustrating a cliche for offset printing of the present invention. As shown in FIG. 2, the cliche for offset printing of the present invention has a mesh pattern with a plurality of intersection units, wherein the plurality of intersection units are formed to have a curved shape. The intersection units refer to parts of intersection of vertical and horizontal lines.

When the intersection units are formed in a curved shape, the width of lines around the intersection units becomes wider, and thus line width reduction may be prevented around the intersection units.

The cliche for offset printing of the related art has a limitation that even a slightly offset contact angle between the doctor blade and the pattern may result in damage to the glass substrate due to the uneven forces applied to regions of the glass substrate. Damage to the substrate frequently occurs, especially around the intersection units. However, when the intersection units are formed in a curved shape as in the present invention, damage to the substrate during printing may be reduced because the contact angle between the intersection unit and the doctor blade is constant, irrespective of the positions of other elements.

In the present invention, the plurality of intersection units are formed to have a curved shape with a radius of curvature 0.6 to 4 times, preferably 1 to 4 times, more preferably 1 to 3 times, and most preferably 1 to 2 times that of a mesh line width. This means that the intersection units of a mesh pattern of the present invention are formed as a part of a circumference with a radius of curvature 0.6 to 4 times, preferably 1 to 4 times, more preferably 1 to 3 times, and most preferably 1 to 2 times that of a mesh line width.

The reason of limiting the form of intersection units in this way is as follows. There are almost no resistance improvement effects when the radius of curvature in a curve part is less than 0.6 times, while the intersection units become so large that permeability may be decreased and the linearity of a line may be deteriorated when the value is more than 4 times. Moreover, when an area of intersection units is increased, depressions by a transformation of a doctor blade may become severe and the height of printing around the intersection units may be considerably lowered, thereby deteriorating surface resistance properties.

In addition, the mesh pattern may vary according to shapes of patterns to be printed and the products to which the mesh pattern is to be applied. In general, the mesh pattern may have a line width (W) in a range of 10 µm to 100 µm and a pitch (P) in a range of 100 µm to 1000 µm. The line width of a mesh pattern refers to the shortest distance between the lines in a perpendicular direction, forming the mesh pattern, and the pitch of a mesh pattern refers to a minimum repeat distance between lines forming the mesh pattern.

When the width of a mesh line is less than 10 µm, line disconnections in the printed pattern frequently occur, resulting in an increase in a final surface resistance, whereas permeability is decreased by the printed pattern when the width is more than 100 µm. In addition, it is conspicuous to see the pattern line. When the pitch is less than 100 µm, permeability may be decreased whereas when the pitch is more than 1000 µm, surface resistance may be increased as both the intervals in the pattern and the pattern are easily visible.

The cliche for offset printing of the present invention may have a flat-type printing plate rather than a roll-type printing plate. A flat-type printing plate provides better linearity of lines than a roll-type printing plate, and as a result, better surface resistance properties may be obtained from a printed matter.

In addition, the cliche for offset printing of the present invention may employ an intaglio plate in which a printing pattern is intagliated or a relief plate in which a printing pattern is embossed.

Further, the cliche for offset printing may desirably include various materials used in the art, such as a metal substrate, a glass substrate, a glass substrate treated with hybrid nickel, and a glass substrate coated with DLC. Among these, a glass substrate treated with hybrid nickel or a glass substrate coated with DLC, having excellent surface strengths is especially desirable.

The cliche for offset printing of the present invention may be used for manufacturing a product having a mesh pattern with a plurality of intersection units. For example, the cliche for offset printing of the present invention may be useful for manufacturing a product having a mesh pattern with a plurality of intersection units, such as a circuit board, a wiring board and an EMI (electromagnetic shielding) filter of an electronic device.

The products formed by the cliche for offset printing of the present invention include a mesh pattern with a plurality of intersection units formed in a curved shape with a radius of curvature 0.6 to 4 times that of a mesh line width.

In the case of products in which the present invention is used, the phenomenon of line width reduction generated around the intersection units is reduced because the intersection units are formed in a curved shape, resulting in an widened line width, and as a result, surface resistance properties of the product may be improved, compared to products in the related art. In particular, by forming the intersection units to have a curved shape to increase only the line width of intersection units, mainly responsible for decrease in resistance properties and maintaining the line width of other parts, the aperture ratio also remains almost unchanged. As a result, because surface resistance properties may be improved without substantially changing permeability and reflectivity, the products in which the present invention are used may be useful for display related devices.

The products of the present invention include a circuit board, a wiring board, an EMI filter, a micro pattern substrate, a thin-film transistor (TFT) wiring and a color filter.

The products of the present invention may be manufactured by a typical offset printing method using the cliche for offset printing of the present invention. For example, the products of the present invention may be manufactured by: applying paste to fill a printing pattern of a cliche for offset printing of the present invention removing extra paste using a doctor blade; transcribing the pattern to a silicon blanket; and transcribing the pattern to a subject to be printed.

Hereinafter, the present invention will be more fully described with reference to the specific embodiments. However, the following embodiments are provided only to describe the present invention, and the scope of the present invention is not limited thereto.

Example 1

80% of silver particles having an average particle diameter of about 2 μm, 18% of a binder which is prepared by mixing a polyester resin with butyl carbitol acetate (BCA) at a ratio of 1:1, and 2% of a glass frit were mixed and kneaded using a 3 roll-mill for 30 minutes to prepare a high-temperature sintering silver paste. The viscosity of the paste was about 8,000 cps (Conditions during measurement: spindle number 5, 1 rpm).

A printing plate with a mesh pattern having a pitch of about 270 μm, a line width of about 20 μm, and a depth of about 9.5 μm with intersection units formed in a curved shape with a radius of curvature of about 20 μm was prepared.

A paste manufactured by the method was applied to the printing plate to fill an intagliated portion with the paste, and the extra paste was removed using a doctor blade. And then, a mesh pattern was printed on a glass substrate in an area of 370×470 mm$^2$, and sintered at 580° C. for 10 minutes.

Subsequently, the permeability, surface resistance and reflectivity of the printed material were measured.

Permeability and reflectivity were measured using a Shimadzu UV-3600 spectrophotometer, and surface resistance was done using a Mitsubishi Chemical Loresta GP.

Example 2

A printed material was prepared and the permeability, surface resistance, and reflectivity of the printed material were measured in the same manner as in Example 1, except that a printing plate having a pitch of about 270 μm, a line width of about 20 μm, and a depth of about 9.5 μm, in which a mesh pattern of intersection units formed in a curved shape with a radius of curvature of about 30 μm was intagliated, was used.

Example 3

A printed material was prepared and the permeability, surface resistance, and reflectivity of the printed material were measured in the same manner as in Example 1, except that a printing plate having a pitch of about 270 μm, a line width of about 20 μm, and a depth of about 9.5 μm, in which a mesh pattern of intersection units formed in a curved shape with a radius of curvature of about 40 μm was intagliated, was used.

Example 4

A printed material was prepared and the permeability, surface resistance, and reflectivity of the printed material were measured in the same manner as in Example 1, except that a printing plate having a pitch of about 270 μm, a line width of about 20 μm, and a depth of about 9.5 μm, in which a mesh pattern of intersection units formed in a curved shape with a radius of curvature of about 60 μm was intagliated, was used.

Example 5

A printed material was prepared and the permeability, surface resistance, and reflectivity of the printed material were measured in the same manner as in Example 1, except that a printing plate having a pitch of about 270 μm, a line width of about 20 μm, and a depth of about 9.5 μm, in which a mesh pattern of intersection units formed in a curved shape with a radius of curvature of about 80 μm was intagliated, was used.

Comparative Example 1

A printed material was prepared and the permeability, surface resistance, and reflectivity of the printed material were measured in the same manner as in Example 1, except that a printing plate, in which a mesh pattern of intersection units was not formed in a curved shape, was used.

Comparative Example 2

A printed material was prepared and the permeability, surface resistance, and reflectivity of the printed material were measured in the same manner as in Example 1, except that a printing plate having a pitch of about 270 μm, a line width of about 20 μm, and a depth of about 9.5 μm, in which a mesh pattern of intersection units formed in a curved shape with a radius of curvature of about 10 μm was intagliated, was used.

Comparative Example 3

A printed material was prepared and the permeability, surface resistance, and reflectivity of the printed material were measured in the same manner as in Example 1, except that a printing plate having a pitch of about 270 μm, a line width of about 20 μm, and a depth of about 9.5 μm, in which a mesh pattern of intersection units formed in a curved shape with a radius of curvature of about 100 μm was intagliated, was used.

Table 1 shows the permeability, surface resistance and reflectivity of a printed material, measured in Examples and Comparative Examples 1 to 3.

TABLE 1

|  | Example 1 | Example 2 | Example 3 | Example 4 | Example 5 | Comparative Example 1 | Comparative Example 2 | Comparative Example 3 |
|---|---|---|---|---|---|---|---|---|
| Surface resistance ($\Omega/\square$) | 0.35 | 0.33 | 0.36 | 0.35 | 0.39 | 0.43 | 0.40 | 0.60 |
| Permeability (%) | 76.4 | 76.2 | 76.3 | 76.1 | 75.3 | 76.4 | 76.3 | 72 |
| Reflectivity (%) | 8.5 | 8.5 | 8.5 | 8.6 | 8.7 | 8.6 | 8.5 | 9.0 |
| Depth of depressions around intersection units (mm) | 2.8 | 3.0 | 3.2 | 3.2 | 3.7 | 2.5 | 2.6 | 5.0 |

As shown in table 1, when the intersection units are formed in a curved shape as in Examples 1 to 5, it can be seen that surface resistance was improved by maximum 23% and permeability was only slightly decreased, as compared to Comparative example 1.

In the case of Comparative Example 2, although the depth of the depressions around the intersection units is similar to those of Comparative Example 1, surface resistance was scarcely improved. In the case of Comparative Example 3, as depressions around intersection units increased, surface resistance was increased and permeability was decreased.

Figure 4:
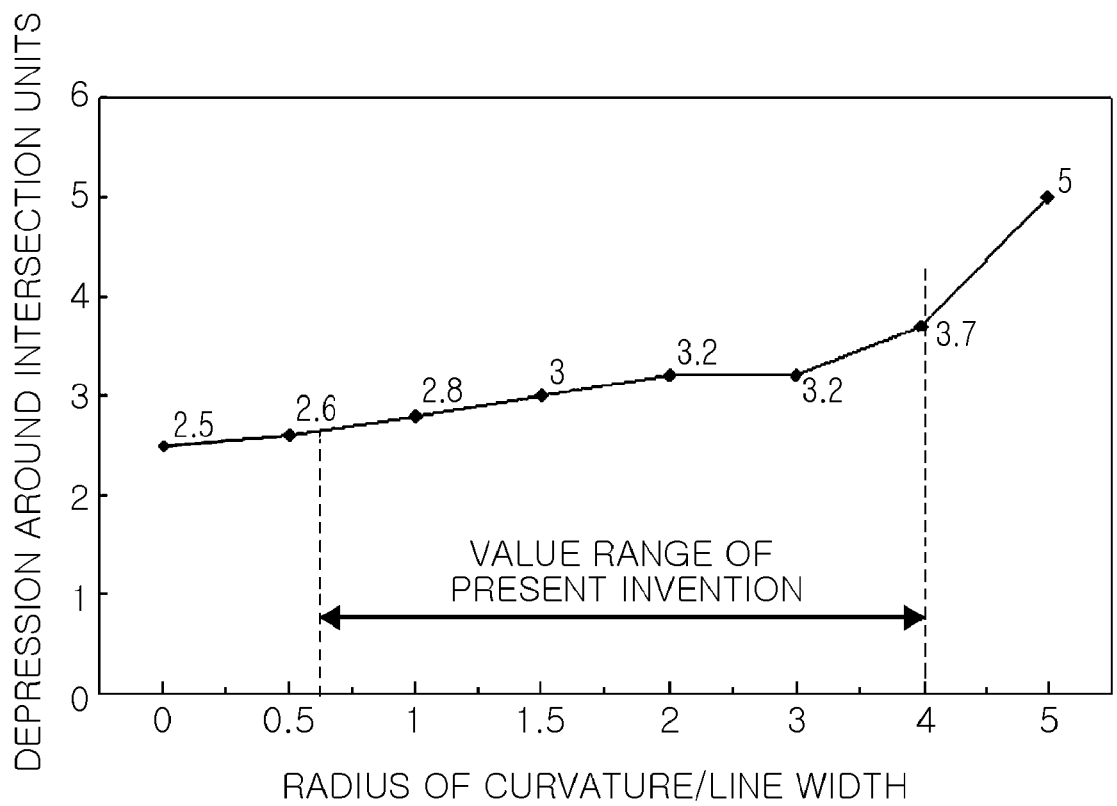
FIG. 4 is a graph illustrating depressions of intersection units of a pattern of a cliche for offset printing according to a radius of curvature around the intersection units.
Figure 5:
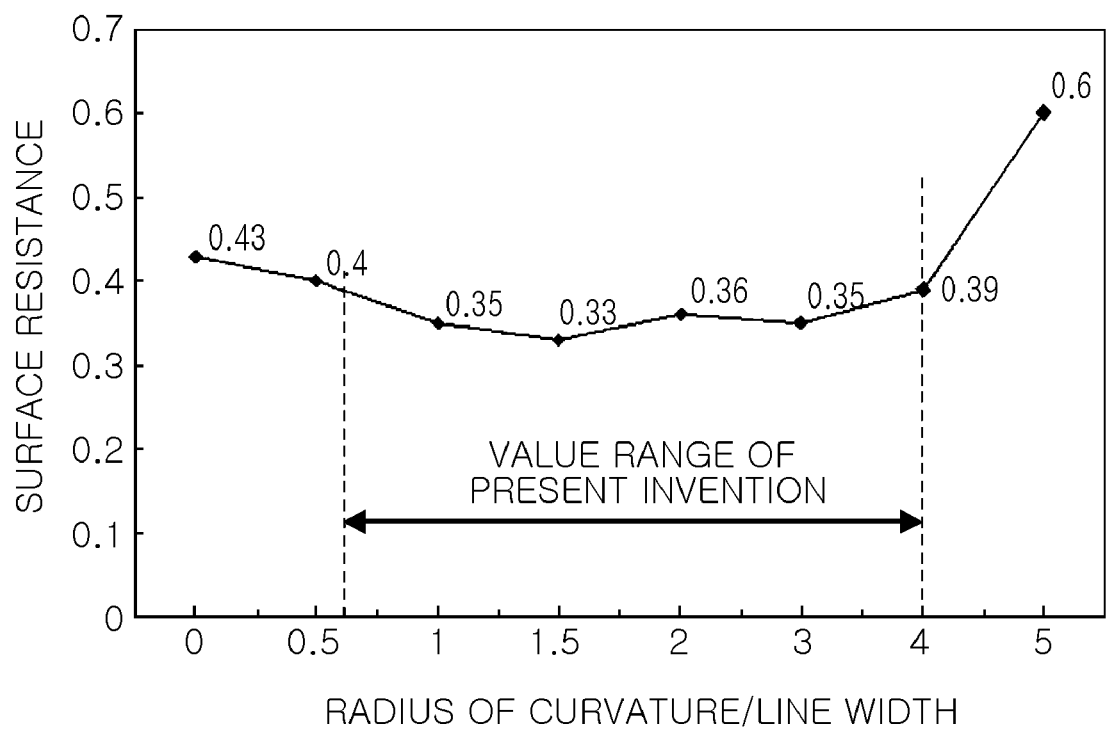
FIG. 5 is a graph illustrating changes in surface resistance according to a radius of curvature around the intersection units of of a pattern of a cliche for offset printing.

FIG. 4 is a graph illustrating depressions of intersection units of a cliche for offset printing in Examples 1 to 5 and Comparative Examples 1 to 3 in accordance with a radius of curvature of the intersection units. FIG. 5 is a graph illustrating changes in surface resistance in accordance with a radius of curvature around the intersection units of a cliche for offset printing in Examples 1 to 5 and Comparative Examples 1 to 3.

According to FIGS. 4 and 5, it can be seen that depressions around intersection units and surface resistance abruptly deteriorated when the radius of curvature around the intersection units exceeds a range of the present invention, that is, exceeds line width by 4 times or more.

While the present invention has been shown and described in connection with the exemplary embodiments, it will be apparent to those skilled in the art that modifications and variations can be made without departing from the spirit and scope of the invention as defined by the appended claims.

The invention claimed is:

1. A cliche for offset printing comprising: a mesh pattern with a plurality of intersection units,
    wherein the plurality of intersection units are formed in a curved shape with a radius of curvature 1 to 4 times that of a mesh line width, and
    wherein the cliche for offset printing consists of a metal substrate, a glass substrate, a glass substrate treated with hybrid nickel, or a glass substrate coated with DLC, and
    wherein the cliche for offset printing is an intaglio plate in which the mesh pattern is intagliated.

2. The cliche of claim 1, wherein the radius of curvature is a distance equal to 1 to 2 times mesh line width.

3. The cliche of claim 1, wherein a line width of the mesh pattern is 10 μm to 100 μm.

4. The cliche of claim 1, wherein a pitch of the mesh pattern is 100 μm to 1000 μm.

5. The cliche of claim 1, wherein the cliche for offset printing is a flat plate.

6. An electronic device manufactured by the cliche for offset printing according to claim 1, comprising a mesh pattern with a plurality of intersection units,
    wherein the plurality of intersection units are formed in a curved shape with a radius of curvature 1 to 4 times that of a mesh line width.

7. The electronic device of claim 6, wherein the product is a wiring board, a circuit board, an EMI (electromagnetic shielding) filter or a color filter.

8. The electronic device of claim 6, wherein the radius of curvature is a distance equal to 1 to 2 times mesh line width.

9. The electronic device of claim 6, wherein a line width of the mesh pattern is 10 μm to 100 μm.

10. The electronic device of claim 6, wherein a pitch of the mesh pattern is 100 μm to 1000 μm.

11. The electronic device of claim 6, wherein the cliche for offset printing is a flat plate.

* * * * *